(12) United States Patent
Takehara

(10) Patent No.: US 8,007,632 B2
(45) Date of Patent: Aug. 30, 2011

(54) SEMICONDUCTOR MANUFACTURING APPARATUS AND MANUFACTURING METHOD OF SEMICONDUCTOR DEVICE

(75) Inventor: Keiichirou Takehara, Kumamoto (JP)

(73) Assignee: Renesas Electronics Corporation, Kanagawa (JP)

( * ) Notice: Subject to any disclaimer, the term of this patent is extended or adjusted under 35 U.S.C. 154(b) by 742 days.

(21) Appl. No.: 12/062,731

(22) Filed: Apr. 4, 2008

(65) Prior Publication Data
US 2008/0248652 A1 Oct. 9, 2008

(30) Foreign Application Priority Data
Apr. 4, 2007 (JP) .................. 2007-098102

(51) Int. Cl.
*H01L 21/306* (2006.01)
*C23C 16/00* (2006.01)
(52) U.S. Cl. ......... 156/345.44; 156/345.43; 156/345.47; 118/723 R; 118/723 E; 118/723 ER
(58) Field of Classification Search ............. 118/723 R, 118/723 E, 723 ER, 723 I, 723 IR, 723 AN; 156/345.43, 345.44, 345.45, 345.46, 345.47, 345.48, 345.49; 315/111.21, 111.31, 111.41, 111.51, 111.61, 111.71, 111.81, 111.91
See application file for complete search history.

(56) References Cited

U.S. PATENT DOCUMENTS
5,846,329 A * 12/1998 Hori et al. ................. 118/723 E
5,922,134 A * 7/1999 Ohbuchi ................. 118/723 ER

FOREIGN PATENT DOCUMENTS
JP 7-37870 2/1995
JP 10-144495 5/1998

* cited by examiner

*Primary Examiner* — Luz L. Alejandro
(74) *Attorney, Agent, or Firm* — Young & Thompson

(57) ABSTRACT

A semiconductor manufacturing apparatus includes a chamber, a gas supplier, a vacuum pump, an electrode, a conductive knitted wire mesh and a radio frequency power supply. The electrode is placed outside of the chamber and fixed to the chamber. The gas supplier supplies gas into the chamber. The vacuum pump exhausts the chamber. The radio frequency power supply supplies radio frequency power to the electrode through the conductive knitted wire mesh.

4 Claims, 5 Drawing Sheets

US 8,007,632 B2

SEMICONDUCTOR MANUFACTURING APPARATUS AND MANUFACTURING METHOD OF SEMICONDUCTOR DEVICE

BACKGROUND OF THE INVENTION

1. Field of the Invention

The present invention relates to a semiconductor manufacturing apparatus and a manufacturing method of a semiconductor device.

2. Description of Related Art

Manufacturing methods of a semiconductor device generally include a wafer process in which a semiconductor wafer is processed, an assembly process and an inspection process. Japanese Laid Open Patent Application (JP-A-Heisei, 7-37870) and Japanese Laid Open Patent Application (JP-A-Heisei, 10-144495) disclose semiconductor manufacturing apparatus used in such wafer process.

FIG. 1 shows the semiconductor manufacturing apparatus 101 disclosed in Japanese Laid Open Patent Application (JP-A-Heisei, 7-37870). The semiconductor manufacturing apparatus 101 is used to remove resist from a wafer 127. The semiconductor manufacturing apparatus 101 includes a bell jar 102, a gas supplier 103, a vacuum chamber 104, a first electrode 106, a second electrode 111, a heater 114 and a conductive member 120. The bell jar 102 is made of quartz. The gas supplier 103 is connected to a top of the bell jar 102. A bottom of the bell jar 102 forms a flange. The bottom of the bell jar 102 is joined to a ceiling of the vacuum chamber 104. A shield electrode 112 forms a part of the ceiling of the vacuum chamber 104. The shield electrode 112 has holes 113 connecting inside of the bell jar 102 to inside of the vacuum chamber 104. The shield electrode 112 is grounded. The first electrode 106 and the second electrode 111 are placed outside of the bell jar 102. The conductive member 120 connects the first electrode 106 to a radio frequency power supply 118. The second electrode 111 is grounded. The heater 114 is placed in the vacuum chamber 104 and heats the wafer 127. A vacuum pump (not shown) connected to the vacuum chamber 104 exhausts the vacuum chamber 104 and the bell jar 102. The gas supplier 103 supplies oxygen gas 121 into the bell jar 102. The radio frequency power supply 118 supplies radio frequency power to the first electrode 106 via the conductive member 120 and then energizes the oxygen gas 121 to form plasma 122 in the bell jar 102. The plasma 122 contains oxygen molecules, oxygen atoms, oxygen ions and electrons. Neutral active species 123 of the plasma 122 enter the vacuum chamber 104 through the holes 113 and reacts with the resist on the wafer 127. Due to the reaction, the resist is removed from the wafer 127. Gas generated by the reaction is exhausted from the vacuum chamber 104 by the vacuum pump.

The present inventor has discovered that when the vacuum pump exhausts the vacuum chamber and bell jar 102, pressure difference is generated between inside and outside of the bell jar 102. Due to the pressure difference, the bell jar 102 is pressed onto the vacuum chamber 104. When an O ring seals between the bell jar 102 and the ceiling of the vacuum chamber 104, the O ring deforms and the bell jar 102 moves toward the vacuum chamber 104. When the first electrode 106 is fixed to the bell jar 102 and the conductive member 120 connecting the first electrode 106 to the radio frequency power supply 118 is a rigid body, due to repeated generation of the pressure difference, repeated load is applied to the bell jar 102 and the first electrode 106. The repeated load may destroy the bell jar 102 and the first electrode 106.

SUMMARY

In one embodiment, a semiconductor manufacturing apparatus includes a chamber, a gas supplier configured to supply gas into the chamber, a vacuum pump configured to exhaust the chamber, an electrode which is placed outside of the chamber and fixed to the chamber, a conductive knitted wire mesh and a radio frequency power supply configured to supply radio frequency power to the electrode through the conductive knitted wire mesh.

According to the embodiment, the conductive knitted wire mesh deforms to accommodate a movement of the chamber when the pressure in the chamber is reduced. Thus, the semiconductor manufacturing apparatus is prevented from being destroyed.

In another embodiment, a manufacturing method of a semiconductor device includes supplying gas into a chamber exhausted by a vacuum pump, generating plasma in the chamber by supplying radio frequency power through a conductive knitted wire mesh to an electrode which is placed outside of the chamber and fixed to the chamber, and processing a to-be-processed material by using the plasma.

According to the other embodiment, the conductive knitted wire mesh deforms to accommodate a movement of the chamber when the pressure in the chamber is reduced. Thus, a semiconductor manufacturing apparatus is prevented from being destroyed which includes the chamber and the electrode.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
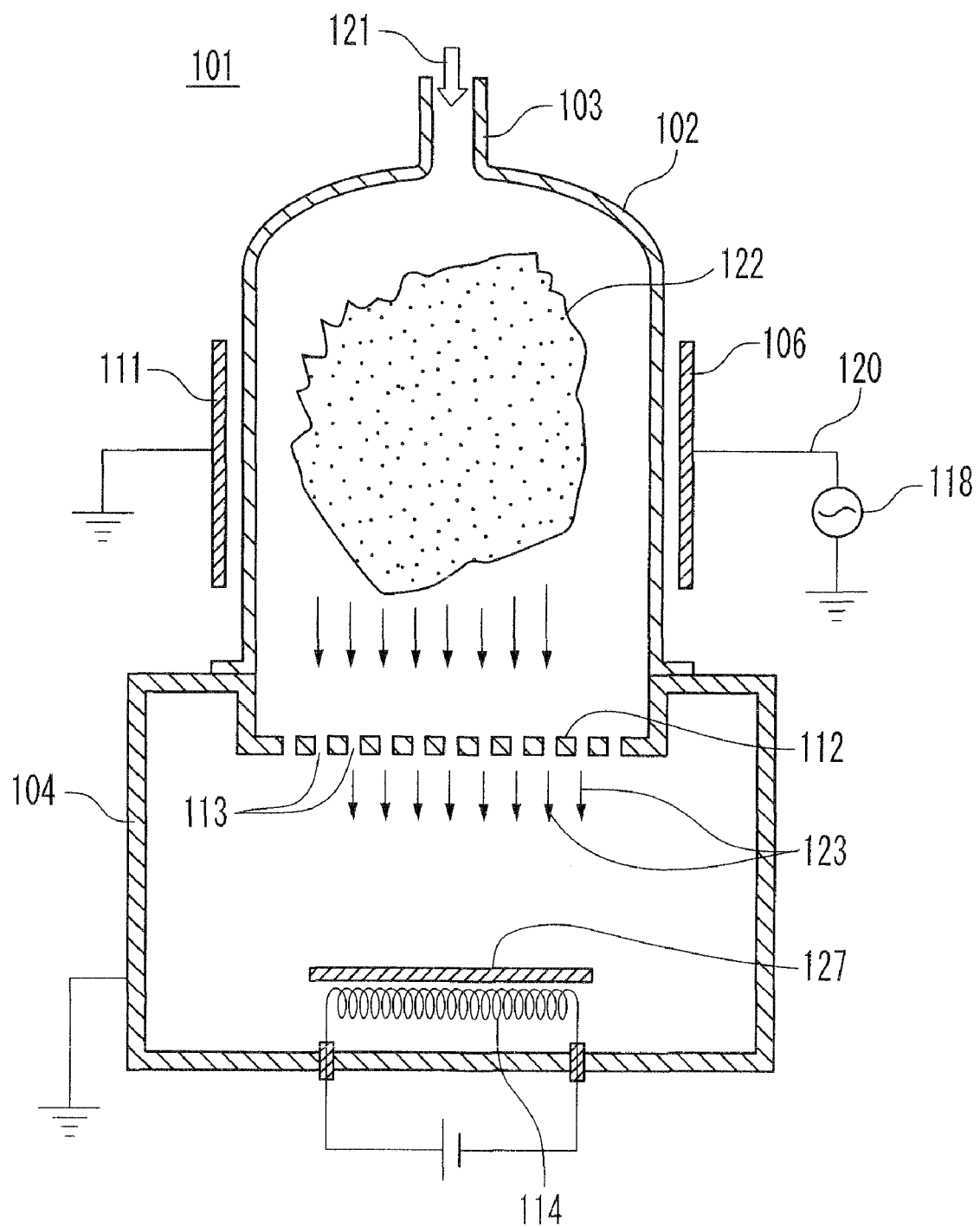
FIG. 1 is a sectional view of a semiconductor manufacturing apparatus according to related art.
Figure 2:
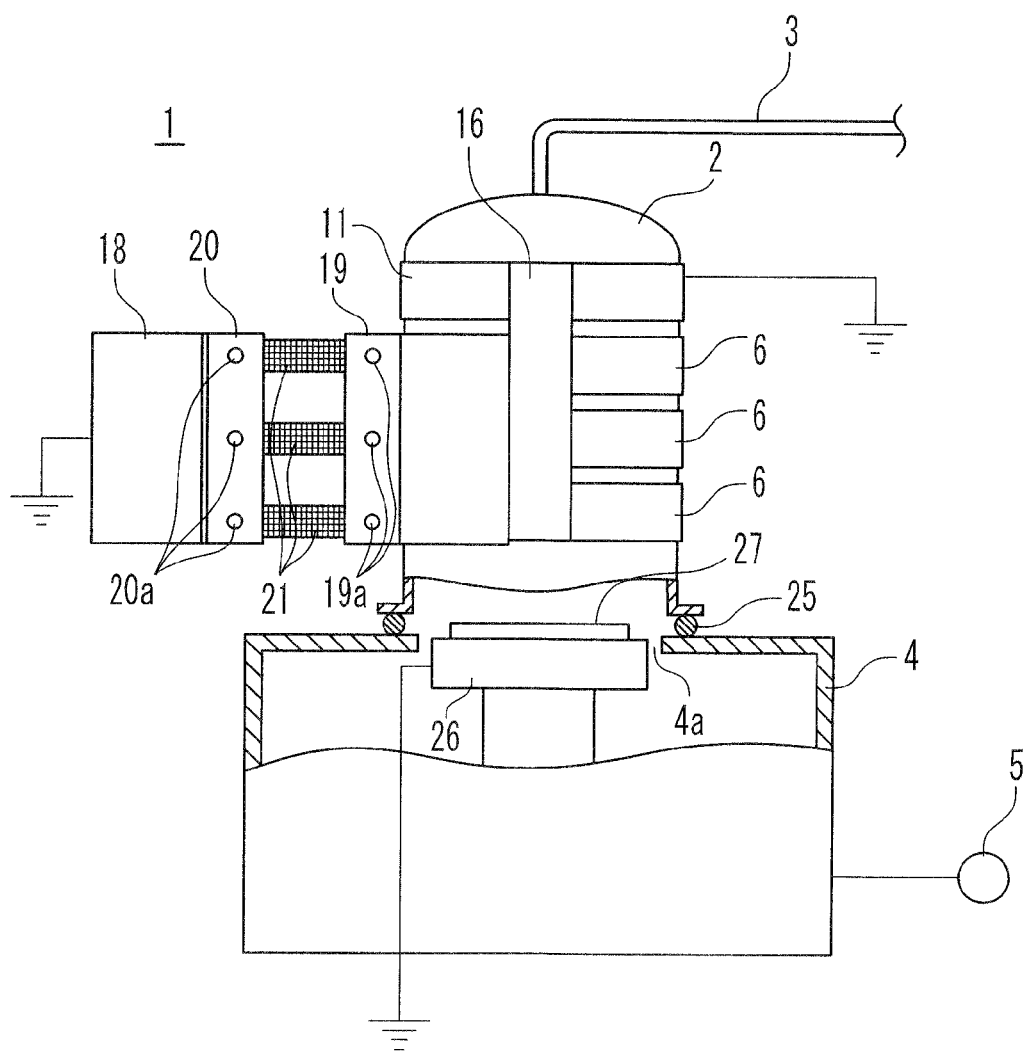
FIG. 2 is a side view of a semiconductor manufacturing apparatus according to a first embodiment of the present invention.

FIG. 2 shows a semiconductor manufacturing apparatus 1 according to a first embodiment of the present invention. The semiconductor manufacturing apparatus 1 is used for, for example, dry etching of a wafer. The semiconductor manufacturing apparatus 1 includes a chamber 2, a gas supplier (or gas supply line) 3, a vacuum chamber 4, a vacuum pump 5, a first electrode 6, a second electrode 11, an insulator 16, an insulator 17 (not shown in FIG. 2), a radio frequency power supply 18, conductive plates 19, conductive plates 20, conductive members 21, a seal member 25 and a base 26.

The chamber 2 is, for example, a bell jar made of quartz. The gas supplier 3 is connected to a top of the chamber 2. A bottom of the chamber 2 forms a flange. The bottom of the chamber 2 is joined to a ceiling of the vacuum chamber 4 via the seal member 25. The seal member 25 is, for example, an O ring. The ceiling of the vacuum chamber 4 has a hole 4a connecting inside of the vacuum chamber 4 to inside of the chamber 2. The base 26 is placed in the vacuum chamber 4 and is grounded. The base 26 supports a to-be-processed material 27 such as semiconductor wafer. The vacuum pump 5 is connected to the vacuum chamber 4. The first electrode 6 and the second electrode 11 are placed outside of the chamber 2. The first electrodes 6 and the second electrode 11 are made of aluminum, for example. Each of the first electrode 6 and the second electrode 11 is wound around the chamber 2. The first electrode 6, the second electrode 11, the insulator 16 and the insulator 17 are fixed to the chamber 2. The second electrode 11 is grounded. The conductive plates 19 are fixed to the first electrode 6. The conductive plates 20 are fixed to the radio frequency power supply 18. Each of the conductive members 21 has one end and the other end opposite to the one end. The one end of the conductive member 21 is mechanically fixed to the conductive plate 20 with a bolt and a nut (not shown). The conductive plate 20 has a hole 20a for fixing the one end of the conductive member 21 with the bolt and the nut. The hole 20a penetrates through the conductive plate 20. The other end of the conductive member 21 is mechanically fixed to the conductive plate 19 with a bolt and a nut (not shown). The conductive plate 19 has a hole 19a for fixing the other end of the conductive member 21 with the bolt and the nut. The hole 19a penetrates through the conductive plate 19. The conductive member 21 electrically connects the first electrode 6 to the radio frequency power supply 18. The first electrode 6 is grounded via the conductive plates 19, the conductive members 21, the conductive plates 20 and the radio frequency power supply 18. The radio frequency power supply 18 has a radio frequency power source and a matching box for impedance matching.

The vacuum pump 5 exhausts the chamber 2 and the vacuum chamber 4. The gas supplier 103 supplies gas to generate plasma into the bell jar 102. The radio frequency power supply 18 supplies radio frequency power to the first electrode 6 via the conductive plates 20, the conductive members 21 and the conductive plates 19 to generates plasma in the chamber 2. The semiconductor manufacturing apparatus 1 processes the to-be-processed material 27 by using the plasma. A part of the gas to generate plasma reacts with the to-be-processed material 27 to generate product gas and another part of the gas to generate plasma does not react. The vacuum pump 5 exhausts the product gas and the other part of the gas to generate plasma from the vacuum chamber 4. After a wafer process, an assembly process and an inspection process are executed for the to-be-processed material 27 processed by the semiconductor manufacturing apparatus 1. Semiconductor devices are manufactured from the to-be-processed material 27.

A detailed structure of the semiconductor manufacturing apparatus 1 will be described below.

Figure 3:
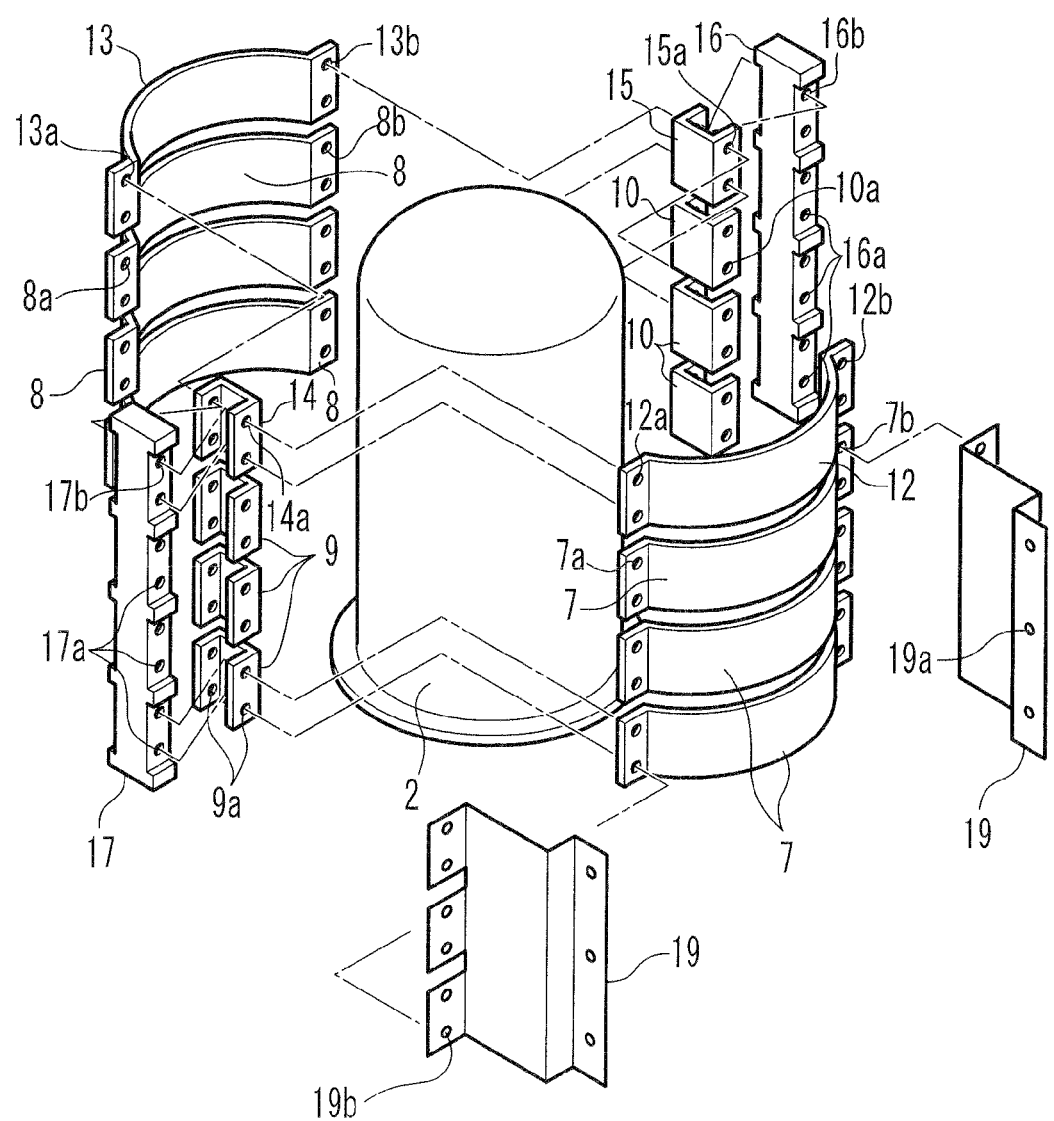
FIG. 3 is a partial exploded view of the semiconductor manufacturing apparatus.

FIG. 3 is a partial exploded view of the semiconductor manufacturing apparatus 1. The semiconductor manufacturing apparatus 1 includes connecting member 9, 10, 14 and 15 as conductors.

The first electrode 6 includes curved belt-like plates 7 and 8. The curved belt-like plates 7 and 8 are arranged both sides of an axis of the chamber 2 and face each other in a first direction across the chamber 2. The first direction is perpendicular to the axis. The curved belt-like plate 7 has one end and the other end opposite to the one end. The one end of the curved belt-like plate 7 has a hole 7a penetrating therethrough. The other end of the curved belt-like plate 7 has a hole 7b penetrating therethrough. The curved belt-like plate 7 is curved between the one end and the other end. Each of two conductive plates 19 has one end and the other end opposite to the one end. The one end of the conductive plate 19 has a hole 19a penetrating therethrough. The other end of the conductive plate 19 has a hole 19b penetrating therethrough. The conductive plate 19 has a bend between the one end and the other end, and notches are formed in the other end such that the notches correspond to steps on the insulator 16 or 17. Each conductive plate 19 is prepared by bending an aluminum plate and making the notches in the aluminum plate. The curved belt-like plate 8 has one end and the other end opposite to the one end. The one end of the curved belt-like plate 8 has a hole 8a penetrating therethrough. The other end of the curved belt-like plate 8 has a hole 8b penetrating therethrough. The curved belt-like plate 8 is curved between the one end and the other end.

The second electrode 11 includes curved belt-like plates 12 and 13. The curved belt-like plates 12 and 13 are arranged both sides of the axis of the chamber 2 and face each other in the first direction across the chamber 2. The curved belt-like plate 12 has one end and the other end opposite to the one end. The one end of the curved belt-like plate 12 has a hole 12a penetrating therethrough. The other end of the curved belt-like plate 12 has a hole 12b penetrating therethrough. The curved belt-like plate 12 is curved between the one end and the other end. The curved belt-like plate 13 has one end and the other end opposite to the one end. The one end of the curved belt-like plate 13 has a hole 13a penetrating therethrough. The other end of the curved belt-like plate 13 has a hole 13b penetrating therethrough. The curved belt-like plate 13 is curved between the one end and the other end.

The connecting member 9 has one end and the other end opposite to the one end. Each of the one end and the other end is shaped like a plate. The one end faces the other end. Each of the one end and the other end has a hole 9a penetrating therethrough. The connecting member 10 has one end and the other end opposite to the one end. Each of the one end and the other end is shaped like a plate. The one end faces the other end. Each of the one end and the other end has a hole 10a penetrating therethrough. The connecting member 14 has one end and the other end opposite to the one end. Each of the one end and the other end is shaped like a plate. The one end faces the other end. Each of the one end and the other end has a hole 14a penetrating therethrough. The connecting member 15 has one end and the other end opposite to the one end. Each of the one end and the other end is shaped like a plate. The one end faces the other end. Each of the one end and the other end has a hole 15a penetrating therethrough.

Each of the insulators 16 and 17 extends parallel to the axis of the chamber 2. The axis extends from the bottom to the top of the chamber 2. The insulator 16 has holes 16a and 16b. The holes 16a and 16b are arranged in different positions along the extending direction of the insulator 16. The insulator 17 has holes 17a and 17b. The holes 17a and 17b are arranged in different positions along the extending direction of the insulator 17.

The other end of one of conductive plates 19, the one end of the curved belt-like plate 7, the one end of the connecting member 9, the insulator 17, the other end of the connecting member 9 and the one end of the curved belt-like plate 8 are arranged along a line parallel to the first direction in this order.

The holes 19*b*, 7*a*, 9*a*, 17*a* and 8*a* overlap each other. The other end of the other of the conductive plates 19, the other end of the curved belt-like plate 7, the one end of the connecting member 10, the insulator 16, the other end of the connecting member 10 and the other end of the curved belt-like plate 8 are arranged along a line parallel to the first direction in this order. The holes 19*b*, 7*b*, 10*a*, 16*a* and 8*b* overlap each other.

The one end of the curved belt-like plate 12, the one end of the connecting member 14, the insulator 17, the other end of the connecting member 14 and the one end of the curved belt-like plate 13 are arranged along a line parallel to the first direction in this order. The holes 12*a*, 14*a*, 17*b* and 13*a* overlap each other. The other end of the curved belt-like plate 12, the one end of the connecting member 15, the insulator 16, the other end of the connecting member 15 and the other end of the curved belt-like plate 13 are arranged along a line parallel to the first direction in this order. The holes 12*b*, 15*a*, 16*b* and 13*b* overlap each other.

A bolt (not shown) is inserted into the holes 19*b*, 7*a*, 9*a*, 17*a* and 8*a* and a nut (not shown) is tightened to the bolt. A bolt (not shown) is inserted into the holes 19*b*, 7*b*, 10*a*, 16*a* and 8*b* and a nut (not shown) is tightened to the bolt. A bolt (not shown) is inserted into the holes 12*a*, 14*a*, 17*b* and 13*a* and a nut (not shown) is tightened to the bolt. A bolt (not shown) is inserted into the hole 12*b*, 15*a*, 16*b* and 13*b* and a nut (not shown) is tightened to the bolt.

The chamber 2, the first electrode 6, the second electrode 11, the conductive plates 19, the insulator 16 and the insulator 17 are fixed to one another with these bolts and nuts. Therefore, the conductive plates 19 and the first electrode 6 (curved belt-like plates 7 and 8) have the same electrical potential.

Figure 4:
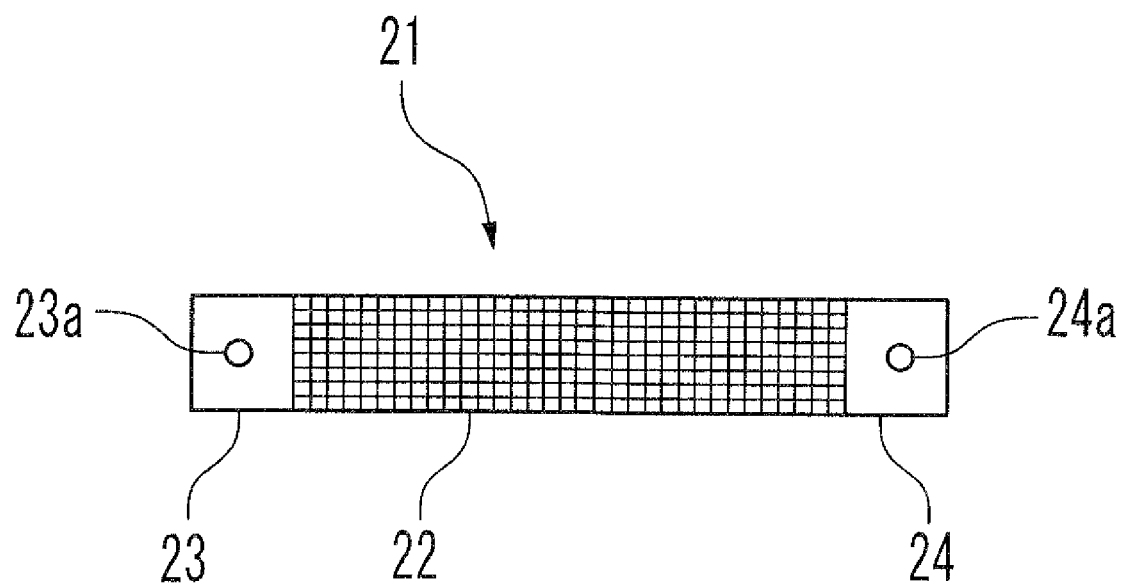
FIG. 4 is a plan view of a conductive member of the semiconductor manufacturing apparatus.

FIG. 4 shows the conductive member 21. The conductive member 21 has a conductive knitted wire mesh 22 and crimp terminals 23 and 24. The crimp terminal 23 has a hole 23*a* penetrating therethrough. The crimp terminal 24 has a hole 24*a* penetrating therethrough. The conductive knitted wire mesh 22 has one end and the other end opposite to the one end. The crimp terminal 23 is crimped to the one end of the conductive knitted wire mesh 22. The crimp terminal 24 is crimped to the other end of the conductive knitted wire mesh 22.

Figure 5:
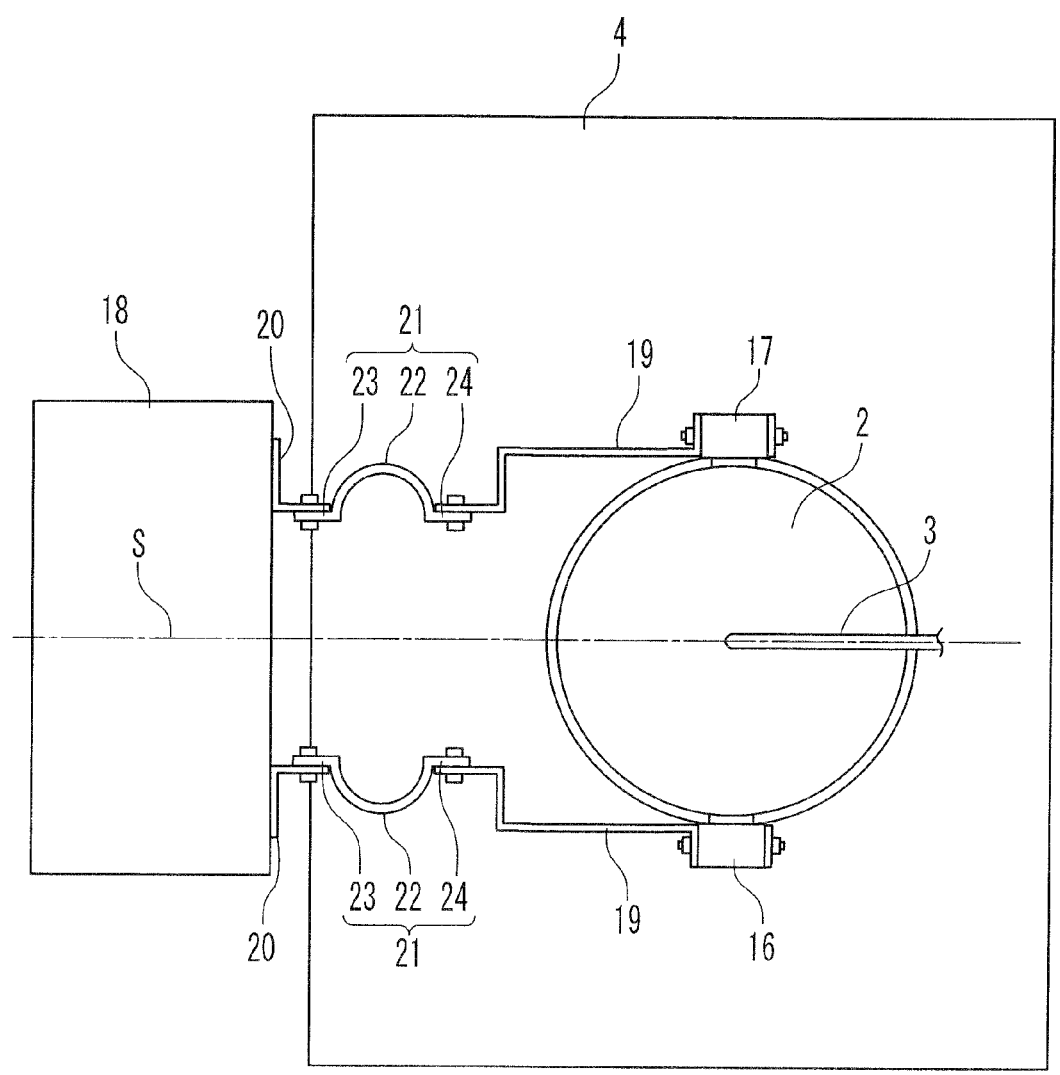
FIG. 5 is a top view of the semiconductor manufacturing apparatus.

FIG. 5 is a top view of the semiconductor manufacturing apparatus 1. The conductive plate 20 and the crimp terminal 23 are placed such that the hole 20*a* and the hole 23*a* overlap each other. The bolt (not shown) is inserted into the holes 20*a* and 23*a* and the nut (not shown) is tightened to the bolt, thereby fixing the crimp terminal 23 to the conductive plate 20. The conductive plate 19 and the crimp terminal 24 are placed such that the holes 19*a* and 24*a* overlap each other. The bolt (not shown) is inserted into the holes 19*a* and 24*a* and the nut (not shown) is tightened to the bolt, thereby fixing the crimp terminal 24 to the conductive plate 19.

In the present embodiment, when pressure in the chamber 2 is reduced and the chamber 2 moves toward the vacuum chamber 4, the conductive knitted wire mesh 22 deforms to accommodate the movement of the chamber 2. For this reason, the chamber 2 and the first electrode 6 are prevented from being destroyed, and resulting in increase in lives of the chamber 2 and the first electrode 6. Furthermore, time for connecting the radio frequency power supply 18 to the first electrode 6 and time for impedance matching are reduced.

It is preferred that the conductive knitted wire mesh 22 is a knitted copper wire mesh which includes a knitted copper wire. Since copper has high toughness, even when the conductive knitted wire mesh 22 deforms repeatedly, the copper wire is hard to be cut.

When the radio frequency power supply 18 supplies radio frequency power to the first electrode 6, the conductive member 21 generates heat. Thus, it is preferred that the conductive member 21 is covered with a chrome-plated film. The chrome-plated film prevents thermal oxidation of the conductive member 21.

Furthermore, when the conductive knitted wire mesh 22 connects the radio frequency power supply 18 and the first electrode 6 in a curved or bent state, the conductive knitted wire mesh 22 can accommodate the movement of the chamber 2 in any direction.

In addition, it is preferred that a plurality of units each including the conductive plate 19, the conductive plate 20 and the conductive member 21 are provided. Supply of radio frequency power can be secured in the case. It is also possible that the unit is provided solely.

When the plurality of units are provided, it is preferred that the plurality of units are arranged plane symmetrically with respect to a plane S containing the axis of the chamber 2. Electrical field which is symmetrical with respect to the plane S is generated in the chamber 2, resulting in uniform quality for the semiconductor devices manufactured from the to-be-processed material 27.

For example, as shown in FIG. 5, a first unit of the plurality of units is placed one side of the plane S and a second unit of the plurality of units is placed the other side of the plane S. The conductive knitted wire mesh 22 of the first unit and the conductive knitted wire mesh 22 of the second unit are bent or curved along a cylindrical surface which is plane symmetrical with respect to the plane S.

It is apparent that the present invention is not limited to the above embodiments, but may be modified and changed without departing from the scope and spirit of the invention.

It should also be noted that this application is based upon and claims the benefit of priority from Japanese patent application No. 2007-098102, filed on Apr. 4, 2007, the disclosure of which is incorporated herein in its entirely by reference.

What is claimed is:

1. A semiconductor manufacturing apparatus comprising:
   a chamber;
   a gas supplier configured to supply gas into said chamber;
   a vacuum pump configured to exhaust said chamber;
   an electrode which is placed outside of said chamber and fixed to the chamber;
   a conductive knitted wire mesh; and
   a radio frequency power supply configured to supply radio frequency power to said electrode through said conductive knitted wire mesh.

2. The semiconductor manufacturing apparatus according to claim 1, wherein said conductive knitted wire mesh is a knitted copper wire mesh.

3. The semiconductor manufacturing apparatus according to claim 2, wherein said knitted copper wire mesh is covered with a chrome-plated film.

4. The semiconductor manufacturing apparatus according to claim 1, wherein said conductive knitted wire mesh connects said radio frequency power supply and said electrode in a curved or bent state.

* * * * *